(12) United States Patent
Landru et al.

(10) Patent No.: US 12,094,759 B2
(45) Date of Patent: *Sep. 17, 2024

(54) METHOD FOR TRANSFERRING BLOCKS FROM A DONOR SUBSTRATE ONTO A RECEIVER SUBSTRATE BY IMPLANTING IONS IN THE DONOR SUBSTRATE THROUGH A MASK, BONDING THE DONOR SUBSTRATE TO THE RECEIVER SUBSTRATE, AND DETACHING THE DONOR SUBSTRATE ALONG AN EMBRITTLEMENT PLANE

(71) Applicant: Soitec, Bernin (FR)

(72) Inventors: Didier Landru, Le Champ-près-Froges (FR); Bruno Ghyselen, Seyssinet (FR)

(73) Assignee: Soitec, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 18/451,486

(22) Filed: Aug. 17, 2023

(65) Prior Publication Data

US 2023/0411205 A1 Dec. 21, 2023

Related U.S. Application Data

(63) Continuation of application No. 17/440,450, filed as application No. PCT/EP2020/058427 on Mar. 25, 2020, now Pat. No. 11,776,843.

(30) Foreign Application Priority Data

Mar. 29, 2019 (FR) ...................................... 1903350

(51) Int. Cl.
*H01L 21/762* (2006.01)
*H01L 21/265* (2006.01)
*H01L 21/78* (2006.01)

(52) U.S. Cl.
CPC .. *H01L 21/76254* (2013.01); *H01L 21/26506* (2013.01); *H01L 21/7813* (2013.01)

(58) Field of Classification Search
CPC ......... H01L 21/26506; H01L 21/76264; H01L 21/7813

(Continued)

(56) References Cited

U.S. PATENT DOCUMENTS

| 7,902,038 B2 * | 3/2011 | Aspar | H01L 21/76254 |
| | | | 438/455 |
| 2004/0238851 A1 * | 12/2004 | Flores | H01L 21/7813 |
| | | | 257/E21.601 |

(Continued)

FOREIGN PATENT DOCUMENTS

| CN | 102144312 A | 8/2011 |
| JP | 2002-299277 A | 10/2002 |

(Continued)

OTHER PUBLICATIONS

Singapore Written Opinion for Application No. 11202110811T dated Jul. 21, 2023, 8 pages.

(Continued)

*Primary Examiner* — Matthew E. Gordon
(74) *Attorney, Agent, or Firm* — TraskBritt

(57) ABSTRACT

A process for transferring blocks from a donor to a receiver substrate, comprises: arranging a mask facing a free surface of the donor substrate, the mask having one or more openings that expose the free surface of the donor substrate, the openings distributed according to a given pattern; forming, by ion implantation through the mask, an embrittlement plane in the donor substrate vertically in line with at least one region exposed through the mask, the embrittlement plane delimiting a respective surface region; forming a block that is raised relative to the free surface of the donor (Continued)

substrate localized vertically in line with each respective embrittlement plane, the block comprising the respective surface region; bonding the donor substrate to the receiver substrate via each block located at the bonding interface, after removing the mask; and detaching the donor substrate along the localized embrittlement planes to transfer blocks onto the receiver substrate.

14 Claims, 5 Drawing Sheets

(58) Field of Classification Search
USPC .......................................................... 438/455
See application file for complete search history.

(56) References Cited

U.S. PATENT DOCUMENTS

| | | | | |
|---|---|---|---|---|
| 2005/0221583 | A1* | 10/2005 | Aspar | H01L 21/76254 |
| | | | | 257/E21.568 |
| 2006/0019476 | A1* | 1/2006 | Lagahe | H01L 21/76254 |
| | | | | 438/514 |
| 2009/0035885 | A1 | 2/2009 | Karlicek et al. | |
| 2009/0104750 | A1* | 4/2009 | Yamazaki | H01L 27/1214 |
| | | | | 257/E21.568 |
| 2014/0203408 | A1* | 7/2014 | Takada | H01L 21/7813 |
| | | | | 257/618 |

FOREIGN PATENT DOCUMENTS

| | | |
|---|---|---|
| JP | 2004-260170 A | 9/2004 |
| JP | 2006-502593 A | 1/2006 |
| JP | 2009-064831 A | 3/2009 |
| JP | 2012-508964 A | 4/2012 |

OTHER PUBLICATIONS

"Chen et al., InP Layer Transfer with Masked Implantation, Electrochemical and Solid-State Letters, vol. 12, No. 4, (2009), pp. H149-H150."
International Search Report for International Application No. PCT/EP2020/058427 dated Jul. 23, 2020, 2 pages.
International Written Opinion for International Application No. PCT/EP2020/058427 dated Jul. 23, 2020, 4 pages.
Taiwanese Office Action and Search Report for Application No. 11220251460 dated Mar. 16, 2023, 6 pages with machine translation.
Japanese Notice of Reasons for Rejection for Application No. 2021-556523 dated May 14, 2024, 6 pages with translation.

* cited by examiner

METHOD FOR TRANSFERRING BLOCKS FROM A DONOR SUBSTRATE ONTO A RECEIVER SUBSTRATE BY IMPLANTING IONS IN THE DONOR SUBSTRATE THROUGH A MASK, BONDING THE DONOR SUBSTRATE TO THE RECEIVER SUBSTRATE, AND DETACHING THE DONOR SUBSTRATE ALONG AN EMBRITTLEMENT PLANE

CROSS-REFERENCE TO RELATED APPLICATIONS

This application is a continuation of U.S. patent application Ser. No. 17/440,450, filed Sep. 17, 2021, now U.S. Pat. No. 11,776,843, issued Oct. 3, 2023, which is a national phase entry under 35 U.S.C. § 371 of International Patent Application PCT/EP2020/058427, filed Mar. 25, 2020, designating the United States of America and published as International Patent Publication WO 2020/200976 A1 on Oct. 8, 2020, which claims the benefit under Article 8 of the Patent Cooperation Treaty to French Patent Application Serial No. FR1903350, filed Mar. 29, 2019.

TECHNICAL FIELD

The present disclosure relates to a process for transferring blocks from a first substrate, referred to as the "donor substrate," to a second substrate, referred to as the "receiver substrate."

BACKGROUND

In the field of semiconductors, the design of semiconductor structures sometimes requires blocks, in the form of portions of a thin layer intended for the production of electronic components, to be transferred to a carrier substrate or receiver substrate.

This type of process is generally referred to as a tiling process, and involves partially transferring a layer to form a given pattern on the carrier substrate. In other words, the carrier substrate is tiled (or covered) with portions of the layer (blocks or tiles), which is generally a thin layer.

The thin layer may be made of a bulk crystalline material (such as a semiconductor) or a layer including a functional structure (epitaxial layer, passive device, etc.). A current exemplary application is that of covering a pre-processed silicon substrate with blocks of III-V material that are configured to incorporate laser devices on silicon photonics platforms.

Several techniques are available for tiling a carrier substrate.

A first technique is that of localized epitaxy, which involves locally forming the tiled structure through epitaxial growth on the carrier substrate. This makes it possible to obtain thin layers, or even complex structures.

The main limitation of this technique lies in the crystal quality of the epitaxied structure, which is in fact relatively low if a lattice parameter of the epitaxied material is different from that of the carrier substrate. Another limitation relates to the relatively high epitaxy temperature, which may damage any electronic devices that are already present in the carrier substrate.

A second technique is that of transferring a tiling layer to the carrier substrate followed by an operation of locally etching the tiling layer. The transfer operation may be performed according to the SMART CUT® process by implanting ions into the tiling layer in order to form an embrittlement zone followed by an operation of detaching a portion of the tiling layer, or by bonding followed by an operation of thinning the tiling layer from the face opposite the bonding interface.

This technique has two main drawbacks: first, the donor substrate must be the same size as the carrier substrate, and second, this technique requires a large amount of donor substrate to be sacrificed, which is an issue when it is of high value, for example, when it is made of a III-V semiconductor material such as III nitrides (for example, indium gallium nitride (InGaN)), III arsenides (for example, indium gallium arsenide (InGaAs)) and III phosphides (for example, indium gallium phosphide (InGaP)).

A third technique, known as the "die-to-wafer" technique, is based on transferring portions of useful material, known as "dice," from a donor substrate to a receiver substrate. According to this technique, the donor substrate is cut into dice, and then each die is placed on the surface of the carrier substrate using a robot. Combining this technique with the SMART CUT® process makes it possible, in particular, to deposit a thin layer of material on the receiver substrate.

This technique is the most versatile, in particular, in that the donor substrate and the receiver substrate may be different sizes, but it is extremely slow and entails very high production costs.

There is also another technique, known as the "microtransfer printing" technique.

Using a stamp made of polydimethylsiloxane (PDMS), a group of electronic chips is lifted from a donor substrate and then transferred to a receiver substrate. The topology of the stamp makes it possible to pick up only a selection of chips in each operation, the chips being distributed in a distribution following the raised portion of the stamp. More specifically, the stamp comprises a plurality of rows of blocks, each intended to detachably accept a chip to be transferred. After a first operation of transferring a first group of chips, a second group of chips may be transferred by applying the same stamp to the same donor substrate, but with the stamp being positioned on another group of chips, offset relative to the first. The chips are lifted from the donor substrate using an operation combining under-etching of the chips or patterns and mechanical detachment.

The detachment operation may however result in deterioration of the surface of the donor substrate and of the transferred electronic chips, possibly compromising their operation. Additionally, this technique requires a large amount of donor substrate to be sacrificed, which is an issue when it is of high value. Furthermore, the blocks of the stamp are organized in a given fixed pattern, such that the chips transferred to the receiver substrate are necessarily organized according to the structure of the stamp, which offers very little freedom as to the pattern to be produced.

BRIEF SUMMARY

One object of the disclosure is to provide a process for transferring blocks from a donor substrate to a receiver substrate that allows the above-described drawbacks to be overcome.

In particular, an object of the disclosure is to provide such a process that is compatible with the transfer of thin layers and with the use of a high-value donor substrate, and that allows more freedom as to the dimensions of the donor substrate and, in particular, the use of a donor substrate of smaller diameter than the receiver substrate.

Another object of the disclosure is to allow the donor substrate to be recycled and reused, which is particularly advantageous in the case of a high-value donor substrate.

To this end, the disclosure provides a process for transferring blocks from a donor substrate to a receiver substrate, comprising the following steps:

arranging a mask facing a free surface of the donor substrate, the mask having one or more openings that expose the free surface of the donor substrate, these being distributed according to a given pattern, so as to form at least one exposed region of the free surface of the donor substrate, and at least one region covered by the mask, forming, by ion implantation through the mask, an embrittlement plane localized in the donor substrate vertically in line with at least one exposed region, the embrittlement plane delimiting, in the thickness of the donor substrate, a respective surface region, forming a block that is raised relative to the free surface of the donor substrate localized vertically in line with each respective embrittlement plane, the block comprising the respective surface region, bonding the donor substrate to the receiver substrate via each block located at the bonding interface, after having removed the mask, detaching the donor substrate along each localized embrittlement plane in order to transfer each respective block to the receiver substrate.

In the present text, the term "vertically in line" refers to a region located facing another in the direction of the thickness of the substrate, i.e., in a direction perpendicular to the main surface of the substrate. The term "localized vertically in line" means a region that is delimited, in a direction parallel to the main surface of the substrate, by the extent of the other region; in other words, a region localized vertically in line with another does not extend beyond this other region in the direction parallel to the main surface of the substrate.

Thus, in particular, in the present process, each block is singulated in the donor substrate by being delimited, in a direction parallel to the main surface of the donor substrate, by a respective embrittlement plane. This allows localized transfer of each block to the receiver substrate.

According to other aspects, the proposed process has the following various features, which may be implemented alone or in technically feasible combinations thereof:

according to the process:
the steps of arranging the mask, of ion implantation, and of forming each block are repeated one or more times on the same donor substrate in order to form at least a second pattern that is offset relative to the preceding pattern, referred to as the first pattern, and
the steps of removing the mask, of bonding, and of detaching are repeated in order to transfer each block from the donor substrate to the same receiver substrate or a different receiver substrate;

to form the second pattern, the mask is arranged so as to cover the recess left in the thickness of the donor substrate by each previously transferred block;

according to the process:
the steps of arranging the mask, of ion implantation, and of forming each block are repeated one or more times on at least a second donor substrate in order to form at least a second pattern, and
the steps of removing the mask, of bonding, and of detaching are repeated in order to transfer each block from the second donor substrate to the same receiver substrate or to a different receiver substrate;

the operation of forming each block comprises an operation of swelling the material of the donor substrate from the free surface of the donor substrate under the effect of ion implantation;

the operation of forming each block comprises an operation of depositing an additional layer on the free surface of the donor substrate through the respective opening;

the operation of depositing the additional layer is performed after ion implantation, at a temperature between 200° C. and 250° C.;

the process further comprises a surface treatment that aims to make the exposed surface of the transferred blocks planar and to decrease the roughness thereof;

the operation of bonding the blocks is accompanied by an operation of thermally annealing the donor substrate and the receiver substrate;

the operation of detaching the donor substrate is initiated thermally or mechanically by applying a mechanical stress with a view to separating the donor substrate from the receiver substrate;

the process further comprises a step of recycling the donor substrate after transferring the blocks by treating the free surface of the donor substrate with a view to making it planar and decreasing the roughness thereof;

the receiver substrate is made of silicon and the blocks of the donor substrate are made of III-V semiconductor material.

BRIEF DESCRIPTION OF THE DRAWINGS

Other advantages and features of the disclosure will become apparent upon reading the following description given by way of illustrative and non-limiting example, with reference to the accompanying figures, in which.

DETAILED DESCRIPTION

The disclosure relates to a process for transferring blocks from a donor substrate to a receiver substrate. This process allows semiconductor structures to be fabricated by transferring one or more blocks to the receiver substrate. Preferably, the receiver substrate is made of silicon.

The blocks take the form of a plurality of portions of a thin layer of the donor substrate, all of which are transferred to the receiver substrate, and on which electronic components may be fabricated, or in which passive or active electronic components have already been formed. Specifically, the thin layer may be made of a bulk crystalline material (such as a semiconductor) or a layer containing a functional structure (an epitaxial layer, a stack of epitaxial layers, a passive or active device, etc.). The blocks form a given pattern on the receiver substrate. The blocks may be, for example, made of a III-V semiconductor material.

Besides a portion of the thin layer, the blocks may also comprise an additional layer, formed by deposition or by epitaxy on the portion of thin layer of the donor substrate before transfer to the receiver substrate.

Generally speaking, the transfer process is based on the blocks being raised relative to the rest of the surface of the donor substrate when the donor substrate is bonded to the receiver substrate. Thus, adhesion between the donor substrate and the receiver substrate occurs only at the blocks. A relative increase in height of about 10 nm is considered to be sufficient for this purpose.

As will be described in detail further below, there are various means for creating this relative increase in height. In particular, this relative increase in height may be created by increasing the thickness of the portion of thin layer of the donor substrate (by swelling the material of the layer and/or by localized deposition or epitaxy of an additional layer on each portion intended to form a block) and/or by removing a surface zone of the donor substrate around the blocks.

Figure 1A:
FIGS. 1A, 1B, 1C, 1D, 1E, 1F, 1G, 1H, 1I and 1J illustrate the process for transferring blocks from a donor substrate to a receiver substrate according to one embodiment.

One embodiment of the transfer process is illustrated in FIGS. 1A to 1J. With reference to FIG. 1A, a substrate 1, called the donor substrate, is initially provided, in which the blocks to be transferred are to be formed. A mask 2 is arranged facing a free surface 3 of the donor substrate.

Figure 1B:
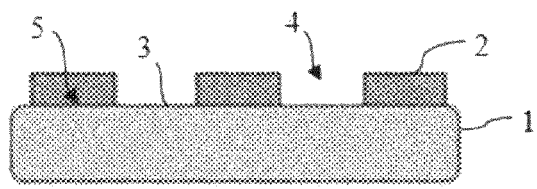

According to a first embodiment illustrated in FIG. 1B, the mask 2 is arranged on and in contact with the free surface 3 of the donor substrate, for example, by depositing the mask. The mask 2 may be a resin or a solid mask, for example, based on oxide or on nitride.

The mask 2 has one or more openings 4 that expose the free surface 3 of the donor substrate. The openings 4 are distributed according to a given pattern that corresponds to the block pattern 10 of the blocks to be formed. This step is thus known as "patterning," referring to the formation of the pattern.

One or more regions 5 covered by the mask are thus formed, these regions being delimited by the openings 4, corresponding to uncovered regions where the free surface 3 of the donor substrate is exposed.

This step of forming the pattern may be carried out by means other than those described above, for example, by lithography or by printing.

Figure 1C:
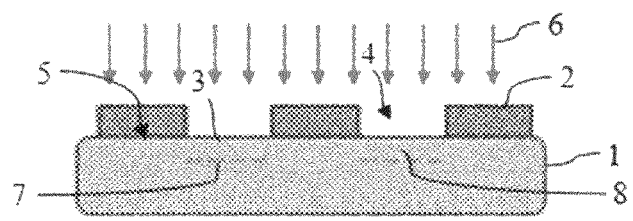
Figure 1D:
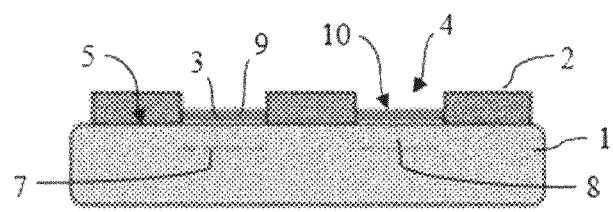
Figure 1E:
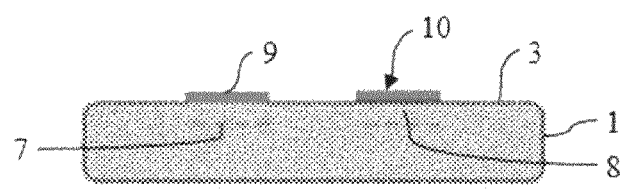
Figure 1F:
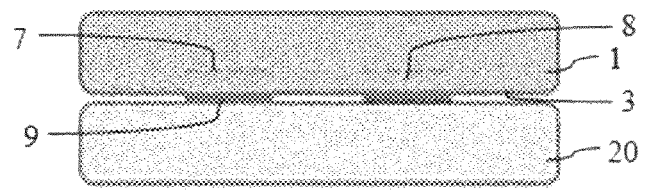
Figure 1G:
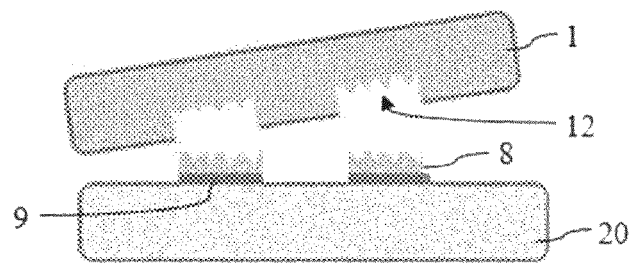
Figure 1H:
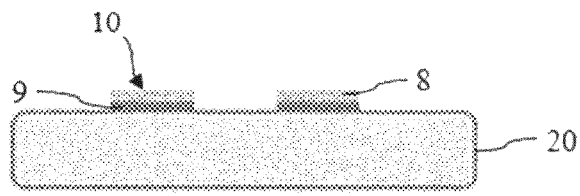
Figure 1I:
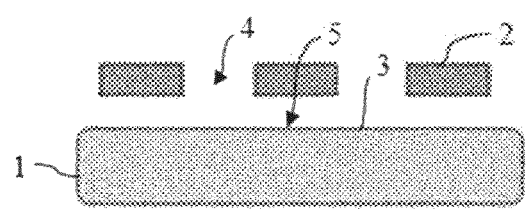

Alternatively, according to a second embodiment illustrated in FIG. 1I, the mask 2 is a solid mask that is not secured to the donor substrate. The mask is configured to form the block pattern 10 and it may be, for example, an ion-implantation mask. According to this embodiment, the mask 2 is placed a given distance away from the free surface 3 of the donor substrate. This second embodiment is advantageous when seeking to prevent interaction with the free surface of the donor substrate in order not to alter its physical and/or chemical properties. Additionally, this embodiment simplifies the process according to the disclosure by omitting a step of arranging the mask on the donor substrate.

FIGS. 1C and 1D illustrate the subsequent steps of the process, in which the mask 2 is shown positioned on and in contact with the free surface of the donor substrate. However, these steps can be carried out by positioning the mask at a distance from the free surface of the donor substrate.

With reference to FIG. 1C, the free surface 3 of the substrate is next exposed to a beam of ionic species 6 through the mask 2.

The ionic species penetrate into the donor substrate 1 via the openings 4, and are implanted into underlying regions of the donor substrate, at a depth determined by the implantation parameters. The ionic species form localized embrittlement planes 7 in the donor substrate, represented in FIG. 1C by dashed lines. Each embrittlement plane 7 is located facing a respective opening 4 in the mask, and delimits, with the free surface 3, a surface region 8 in the thickness of the substrate.

Those ionic species that encounter the mask 2 are blocked by the mask and do not penetrate into the donor substrate 1.

Preferably, the ionic species implanted are hydrogen ions and/or helium ions. A person skilled in the art is able to determine the implantation parameters, in particular, the nature of the ionic species, the dose and the energy of the species, in order to implant the ionic species into the donor substrate at the desired depth.

Additionally, each surface region 8 is raised relative to the free surface 3 of the donor substrate, so as to form a respective block 9 of increased height relative to the free surface 3.

According to a first embodiment (not illustrated), the operation of forming the blocks 9 is performed prior to ion implantation, in a separate step. In other words, the surface regions 8 are raised, then the raised surface regions 8 are subjected to ion implantation.

To do this, it is possible, for example, to deposit an additional layer on the free surface of each surface region, through a respective opening 4 in the mask. The additional layer is deposited at a temperature suitable for avoiding the denaturing of the donor substrate. The temperature of deposition of the additional layer also depends on the material of the donor substrate and on the material of the blocks to be transferred.

The material of the additional layer is chosen so as to allow the blocks to be bonded to the receiver substrate. Thus, the material of the additional layer is a bonding material, preferably chosen from: $SiO_2$, $Si_3N_4$, a metal, or amorphous silicon.

Alternatively, it is possible to perform epitaxy from the surface region 8 in order to form the block.

According to a second embodiment illustrated in FIG. 1D, the operation of forming the blocks 9 is performed after ion implantation, in a separate step. In other words, the surface regions 8, which have already undergone ion implantation, are raised.

To do this, it is possible, for example, to deposit an additional layer on the free surface of each surface region, through a respective opening 4 in the mask. The additional layer is deposited at a temperature lower than the maturation temperature of the implanted ions, i.e., a temperature lower than 250° C., preferably between 200° C. and 250° C. The temperature of deposition of the additional layer also depends on the material of the donor substrate and on the material of the blocks to be transferred.

Alternatively, it is possible to perform epitaxy from the surface region 8 in order to form the block.

In these two embodiments, each block consists of the surface region 8 and of the additional layer. Additionally, when the mask is deposited, it is advantageously chosen from a material that performs a masking function with respect to the implantation and with respect to the deposition/epitaxy. Thus, a single mask is sufficient for forming the blocks, which minimizes the number of steps in the process and avoids the alignment defects that may be encountered when using more than one mask.

Figure 1J:
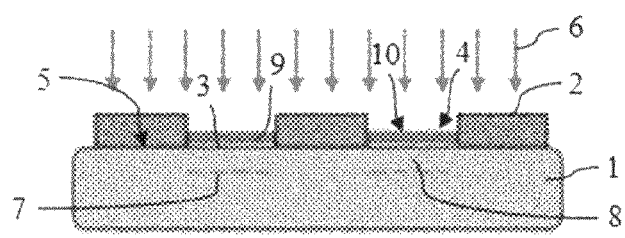

According to a third embodiment illustrated in FIG. 1J, the operation of forming the blocks 9 is performed concomitantly with ion implantation. In other words, each raised block is formed by swelling the material of the donor substrate 1 from the free surface 3 of the donor substrate under the effect of ion implantation. Specifically, it is known that ion implantation, for example, of silicon, generally results in a swelling of the material and hence an increase in height of the implanted surface. This swelling may reach a few nanometers, or a few tens of nanometers. The increase in height of the implanted surface due to the swelling depends on the implantation conditions, in particular, on the species implanted, the dose and the implantation energy.

According to a fourth embodiment, it is possible to raise the surface regions indirectly by etching not only the mask previously deposited on the donor substrate, but also a surface region of the donor substrate by a thickness corresponding to the desired increase in height.

A first example involves arranging a second mask on top of the mask arranged previously, called the first mask. The second mask is complementary to the first mask, i.e., the second mask covers the openings delimited by the first mask but does not cover the regions covered by the first mask. Next, the first mask is etched in the regions covered by the first mask, along with the surface region of the donor substrate. A second example involves depositing a layer of sacrificial material in the openings in the mask, then in selectively etching the mask, the sacrificial material protecting the regions intended to form the blocks. The etch is continued into the thickness of the donor substrate, in the regions previously covered by the mask, in order to form cavities in the thickness of the donor substrate that delimit the layers of sacrificial material. Next, the sacrificial material is removed to expose the surface of the blocks, which is then raised relative to the etched surface of the donor substrate.

All or some of the preceding embodiments can be combined.

For example, it is possible to deposit an additional layer on the free surface of each surface region, then to carry out ion implantation through the additional layer to form the surface regions 8, and to raise the surface regions 8, in order to form the raised blocks 9.

According to another example, it is possible to carry out ion implantation to concomitantly form the blocks 9, then to raise the blocks 9 further after the ion implantation.

What is obtained, after removing the mask 2, is a donor substrate 1 with blocks 9 that are raised relative to its free surface (the original or result from etching, as the case may be), which is used to transfer all or some of these blocks 9 to one or more receiver substrates 20. One embodiment of the block transfer process is illustrated in FIGS. 1F, 1G and 1H.

With reference to FIG. 1F, the donor substrate 1 is bonded to the receiver substrate 20.

The donor substrate 1 and the receiver substrate 20 are first positioned facing one another. The bonding is carried out via the blocks 9, which form the bonding interface. More specifically, bonding occurs only at the blocks 9. The regions 5 of the free surface of the donor substrate 1 previously covered by the mask 2 stay away from the receiver substrate 20.

The donor substrate 1 is then detached along the embrittlement planes 7, as illustrated in FIG. 1G. A fracture is initiated and then propagated at the site of the embrittlement planes, which by definition are weaker zones of the substrate. The blocks 9 of the donor substrate 1 are thus transferred to the receiver substrate 20. The fracture may be triggered spontaneously by heating the assembly of substrates to a given temperature, and/or it may be triggered by applying a mechanical stress to the donor substrate.

Given that the donor substrate 1 is fractured at the sites of the embrittlement planes 7, the free surface 3 of the surface regions 8 of the blocks 9, which is opposite the receiver substrate 20 relative to the block 9, generally exhibits a high degree of roughness. The free surface of each transferred surface region is therefore preferably treated in order to smooth it and to decrease the roughness thereof, for example, by chemical-mechanical polishing (CMP) or chemical and/or heat treatment.

The receiver substrate 20 obtained is shown in FIG. 1H. It comprises the blocks 9 comprising the surface regions 8, the free surface 3 of which has preferably been treated.

The process of the disclosure makes it possible to transfer all of the constituent blocks 9 of the block pattern 10 from the donor substrate 1 to the receiver substrate 20 in a single iteration of the process, after completing the bonding step and the detaching step, which decreases the production times and hence the production costs for semiconductor structures fabricated in this way with respect to known processes.

One advantage of the process of the disclosure lies in the possibility of using the same donor substrate more than once, without it being necessary to recycle it.

The reuse and the recycling of the donor substrate are two different aspects, which will be now described below.

The reuse of the donor substrate 1 involves one or more additional iterations of the steps described above. In other words, the steps of depositing the mask 2 and of forming each block are repeated one or more times on the same donor substrate, in regions of the donor substrate that were not used in the first iteration of the process, in order to form at least a second block pattern 10b that is offset relative to the preceding pattern, called the first block pattern 10a (see FIGS. 3 and 4). The steps of removing the mask 2, of bonding, and of detaching are also repeated in order to transfer each block 9a from the donor substrate 1 to the same receiver substrate 20 or to a different receiver substrate.

One embodiment illustrating the reuse of the donor substrate 1 obtained after having detached from the receiver substrate 20 in FIG. 1G is schematically shown in FIGS. 2A to 2E.

Figure 2A:
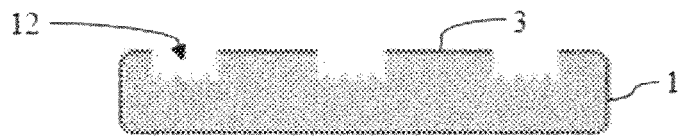
FIGS. 2A, 2B, 2C, 2D and 2E illustrate the reuse of the donor substrate.

The donor substrate 1 to be reused is illustrated in FIG. 2A. The mask 2 is arranged facing the free surface 3 of the donor substrate.

The mask 2 has one or more openings 4 that expose the free surface of the donor substrate. The openings 4 are distributed according to a given second block pattern 10b that corresponds to the block pattern that will be formed on the donor substrate. This second block pattern 10b is offset in the plane of the free surface 3 of the donor substrate relative to the first block pattern 10a formed previously in the first iteration of the process.

The mask 2 may be arranged according to the first embodiment described above in which the mask is arranged on and in contact with the free surface 3 of the donor substrate, or according to the second embodiment described above in which the mask is arranged a given distance away from the free surface of the donor substrate.

Figure 2B:
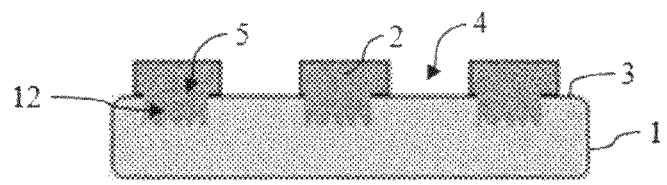

Whichever embodiment is used for arranging the mask, the mask 2 is preferably arranged so as to cover the recess 12 left in the thickness of the donor substrate 1 by each previously transferred block 9b, as illustrated in FIG. 2B.

Figure 2C:
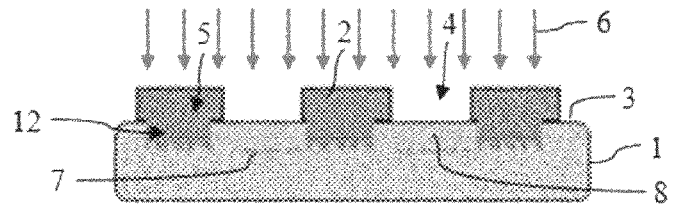

With reference to FIG. 2C, the free surface 3 of the donor substrate on which the mask 2 was deposited is then exposed to the beam of ionic species. Embrittlement planes 7 are thus formed in the donor substrate, schematically represented in FIG. 2C by dashed lines. Each embrittlement plane 7 is located facing a respective opening 4 in the mask, and delimits, with the free surface of the substrate, a surface region 8.

Each surface region 8 is raised relative to the free surface 3 of the donor substrate, so as to form one or more blocks 9b of increased height relative to the free surface 3, arranged according to a second block pattern 10b.

The increase in height is achieved in a manner analogous to the first pattern, advantageously according to one embodiment or a combination of the embodiments described above.

Figure 2D:
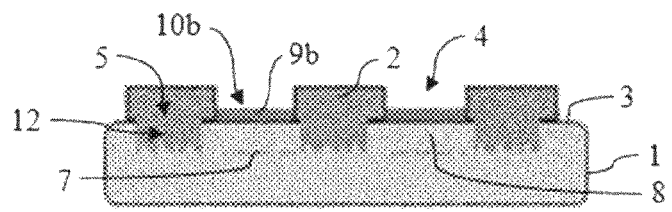

Once the blocks 9b have been formed, what is then obtained is the donor substrate 1 illustrated in FIG. 2D, comprising the regions 5 covered by the mask and the second block pattern 10b.

Figure 2E:
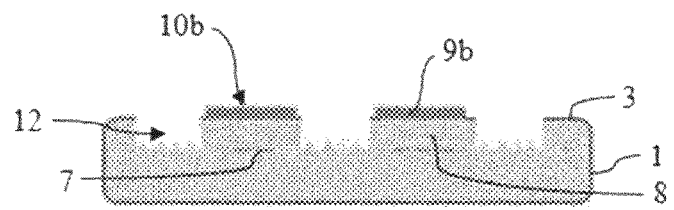

After removing the mask 2, the donor substrate 1 illustrated in FIG. 2E is used to transfer the second block pattern 10b to the same receiver substrate 20 as before in the first iteration of the process, or to a different receiver substrate.

Figure 3:
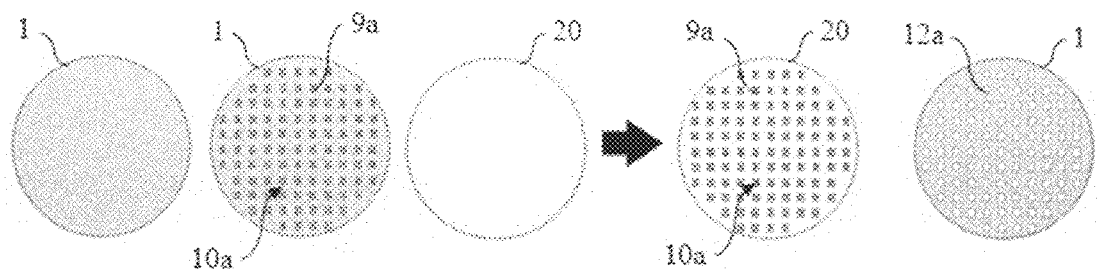
FIG. 3 illustrates a first operation of transferring blocks from a donor substrate to a receiver substrate, viewed from above.
Figure 4:
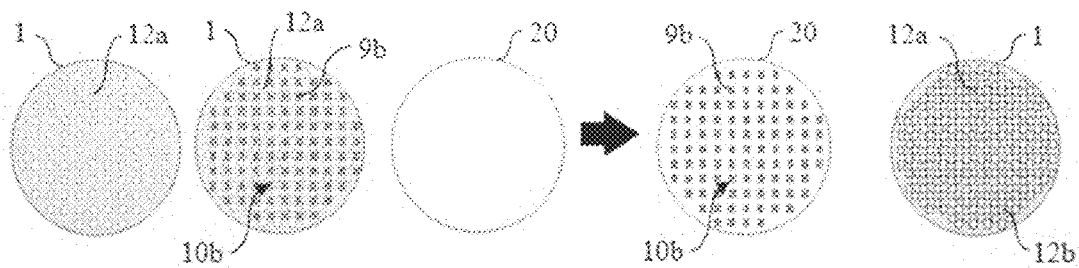
FIG. 4 illustrates a second operation of transferring blocks to another receiver substrate while reusing the donor substrate from FIG. 3, viewed from above.

FIGS. 3 and 4 illustrate the reuse of one and the same donor substrate to transfer a plurality of block patterns to different receiver substrates.

With reference to FIG. 3, a first block pattern 10a is formed on the donor substrate 1, then the first block pattern 10a is transferred to the receiver substrate 20 by bonding the blocks 9a to the free surface 3 of the receiver substrate 20 and then detaching the donor substrate. What is obtained is the receiver substrate 20 with the pattern of transferred blocks 9a, and the donor substrate 1 with the recesses 12a from the transferred blocks 9a extending into the thickness thereof, from the free surface of the donor substrate.

With reference to FIG. 4, and solely by way of example, the same donor substrate 1 is reused by pivoting it by 180° relative to an axis perpendicular to the free surface of the substrate, and a second block pattern 10b is formed therein. The second block pattern 10b is offset in the plane of the free surface 3 of the substrate relative to the first block pattern 10a and formed analogously to the first pattern. The second block pattern 10b is transferred to a receiver substrate 20 different from the preceding one, by bonding the blocks 9b to the free surface of the receiver substrate and then detaching the donor substrate. What is obtained is the receiver substrate 20 with the second transferred block pattern 10b, and the donor substrate 1 with the recesses 12b from the transferred first block pattern 10a and second block pattern 10b extending into the thickness thereof, from the free surface of the donor substrate.

The embodiment of FIG. 4 illustrates the possibility of reusing the same donor substrate more than once for a plurality of successive transfer operations, without having to recycle it.

According to another embodiment, the second block pattern 10b may be transferred to the receiver substrate 20, which already includes the first block pattern 10a or another pattern that does not interfere with the second block pattern 10b.

Recycling the donor substrate 1 involves treating its free surface 3 that was previously used for the transfer of a block pattern in order to remove the damaged regions that comprised the blocks 9 before they were transferred to the receiver substrate 20. The free surface of the donor substrate is made substantially planar and exhibits decreased roughness with respect to its state before recycling. In this way, a surface state of the donor substrate that is comparable to how it was before being used in the transfer process of the disclosure is recreated.

Recycling allows maximum use to be made of the entire donor substrate by limiting waste, which is very particularly advantageous when the donor substrate is of high value, for example, when it is made of a III-V semiconductor material.

Recycling is possible and advantageous because ion implantation and detaching consume only a small layer of material in the thickness of the substrate.

A surface treatment that is suitable for the recycling of the donor substrate is chemical-mechanical polishing/planarization (CMP).

Figure 5A:
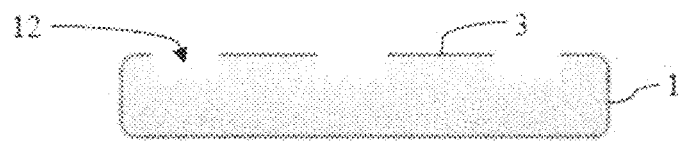
FIGS. 5A, 5B, and 5C illustrate the recycling of the donor substrate.
Figure 5B:
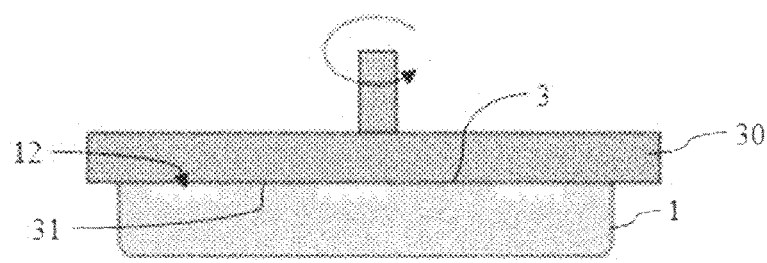
Figure 5C:

One embodiment illustrating the recycling of the donor substrate obtained after having detached from the receiver substrate in FIG. 1G is schematically shown in FIGS. 5A, 5B and 5C.

The donor substrate 1 to be recycled is illustrated in FIG. 5A. With reference to FIG. 5B, a planar surface 31 of a smoothing device 30 is next applied to the damaged free surface 3 of the donor substrate, and then the device is rotated on an axis perpendicular to the plane of the substrate in order to smooth the free surface. The donor substrate 1 obtained after smoothing is shown in FIG. 5C.

Of course, recycling and reuse can be combined in order to carry out several iterations of the transfer process according to the disclosure. For example, the donor substrate may be recycled after several reuses to transfer several block patterns. The substrate may then be reused for one or more other iterations of the process, then recycled again.

FIGS. 6 to 9 illustrate the transfer of blocks in several iterations of the transfer process according to the disclosure. Four distinct block patterns 10a, 10b, 10c and 10d are transferred by using a different donor substrate for each transfer, to one and the same receiver substrate. The donor substrates 1a, 1b, 1c and 1d all have substantially the same diameter, which is smaller than the diameter of the receiver substrate 20.

Because the diameter of the donor substrate is smaller than that of the receiver substrate, it allows all of the blocks to be transferred from each donor substrate, in a single transfer, to a given region of the free surface of the receiver substrate. It therefore becomes possible to construct a final block pattern by assembling a plurality of block patterns transferred by several successive iterations of the process of the disclosure.

According to another embodiment, the method also makes it possible to transfer blocks from different substrates so as to transfer blocks of different natures or with different functionalities to the receiver substrate.

Figure 6:
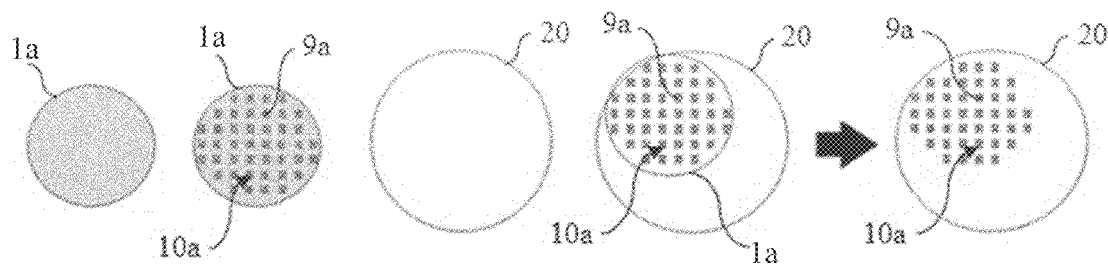
FIGS. 6, 7, 8 and 9 illustrate operations of transferring blocks arranged according to different patterns, in the case of a donor substrate that is smaller in diameter than the receiver substrate.

With reference to FIG. 6, a first block pattern 10a is formed on a first donor substrate 1a, and then the block pattern is transferred to a given first region of the free surface of the receiver substrate. When bonding, the first donor substrate 1a is positioned facing the receiver substrate 20 such that all of the blocks 9a come into contact with the free surface 3 of the receiver substrate and are transferred to the receiver substrate. In FIG. 6, the first donor substrate 1a extends very slightly beyond the periphery of the receiver substrate 20.

Once the transfer has been completed, the free surface of the receiver substrate is partially covered, in a first region, by the first transferred block pattern 10a.

Figure 7:
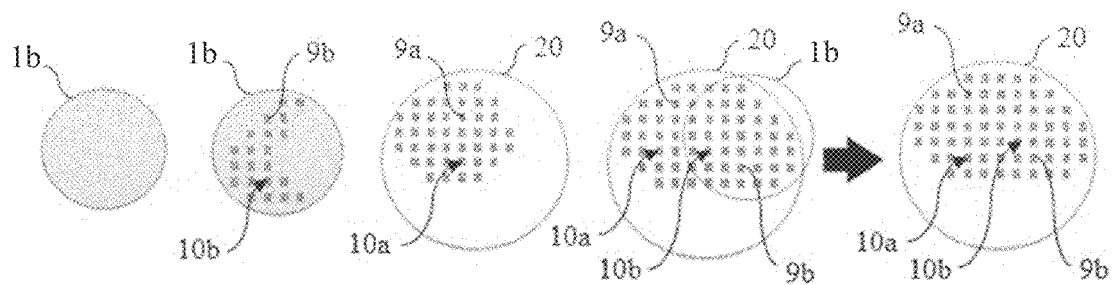

With reference to FIG. 7, a second block pattern 10b is formed on a second donor substrate 1b, and then this second block pattern 10b is transferred to a given second region of the free surface of the same receiver substrate 20. The second block pattern 10b transferred to the receiver substrate complements the first block pattern 10a, such that the rows and columns of blocks 9a of the second block pattern 10b at least partly complement the rows and columns of the first block pattern 10a, respectively. In FIG. 7, the second donor substrate 1b extends slightly beyond the periphery of the receiver substrate 20.

Figure 8:
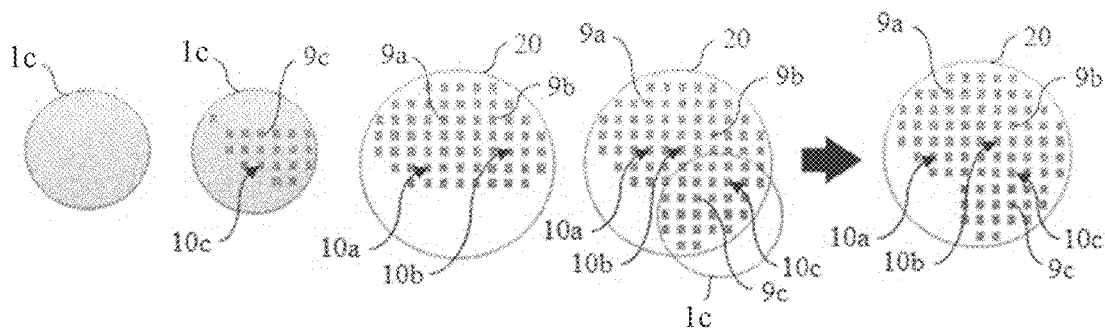

With reference to FIG. 8, a third block pattern 10c is formed on a third donor substrate 1c, and then this third block pattern 10c is transferred to a given third region of the free surface of the same receiver substrate 20. The third pattern 10c transferred to the receiver substrate complements the first block pattern 10a and the second block pattern 10b, such that the rows and columns of blocks of the third pattern 10c at least partly complement the rows and columns of the first block pattern 10a and of the second block pattern 10b, respectively. In FIG. 8, the third donor substrate 1c extends beyond the periphery of the receiver substrate 20.

Figure 9:
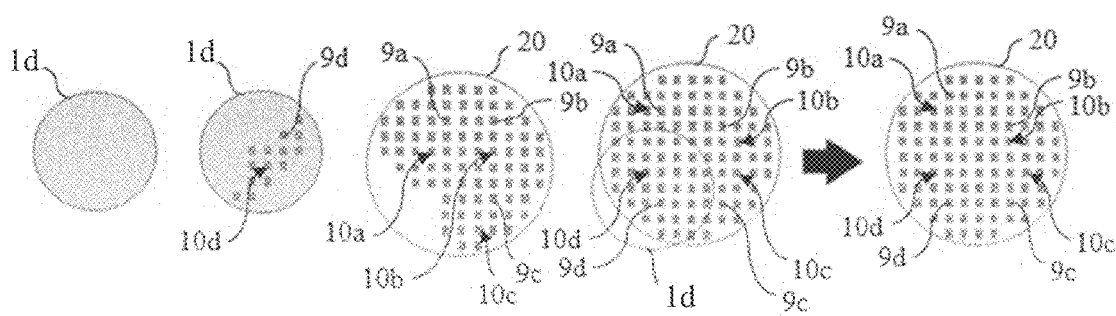

With reference to FIG. 9, a fourth block pattern 10d is formed on a fourth donor substrate 1d, and then this fourth block pattern 10d is transferred to a given fourth region of the free surface of the same receiver substrate 20. The fourth block pattern 10d transferred to the receiver substrate complements the first block pattern 10a, the second block pattern 10b and the third pattern 10c such that the rows and columns of blocks 9d of the fourth block pattern 10d at least partly complement the rows and columns of the first block pattern 10a, of the second block pattern 10b and of the third pattern 10c, respectively. In FIG. 9, the fourth donor substrate 1d extends beyond the periphery of the receiver substrate 20.

Once the four transfer steps have been completed, what is formed is a final block pattern 10 on the receiver substrate 20, composed of the four block patterns 10a, 10b, 10c and 10d transferred in succession.

What is claimed is:

1. A method for transferring blocks from a donor substrate to a receiver substrate, comprising:
    forming, by ion implantation, a discontinuous embrittlement plane having localized implanted regions in the donor substrate, the discontinuous embrittlement plane delimiting, in a thickness of the donor substrate, a surface region of the donor substrate;
    forming blocks raised relative to a free surface of the donor substrate, each of the blocks located vertically in line with a respective one of the localized implanted regions of the discontinuous embrittlement plane, each block comprising a portion of the respective surface region of the donor substrate;
    bonding the donor substrate to the receiver substrate via each block at a bonding interface; and
    detaching the donor substrate at the localized implanted regions along the discontinuous embrittlement plane to transfer each respective block to the receiver substrate.

2. The method of claim 1, further comprising:
    repeating the forming, by ion implantation, the discontinuous embrittlement plane and the forming blocks one or more times on the same donor substrate to form at least one additional block that is offset relative to the blocks; and
    repeating the bonding and the detaching to transfer each block from the donor substrate to the same receiver substrate or a different receiver substrate.

3. The method of claim 2, wherein the forming the at least one additional block further comprises forming a mask arranged so as to cover a recess left in a thickness of the donor substrate by each previously transferred block.

4. The method of claim 1, further comprising:
    repeating the forming, by ion implantation, the discontinuous embrittlement plane and forming blocks one or more times on at least an additional donor substrate to form at least one further additional block; and
    repeating the bonding and the detaching one or more times to transfer the at least one further additional block from the additional donor substrate to the same receiver substrate or to a different receiver substrate.

5. The method of claim 1, wherein the forming blocks raised relative to the free surface of the donor substrate comprises swelling material of the donor substrate from the free surface of the donor substrate by ion implantation.

6. The method of claim 1, wherein the forming blocks raised relative to the free surface of the donor substrate comprises depositing an additional layer on the free surface of the donor substrate.

7. The method of claim 6, wherein the depositing of the additional layer is performed after forming, by ion implantation, the discontinuous embrittlement plane, the depositing of the additional layer being performed at a temperature between 200° ° C. and 250° C.

8. The method of claim 1, further comprising performing a surface treatment for planarizing an exposed free surface of the transferred blocks and decreasing roughness of the exposed free surface.

9. The method of claim 1, wherein the bonding of the donor substrate to the receiver substrate via each block at the bonding interface further comprises thermally annealing the donor substrate and the receiver substrate.

10. The method of claim 1, wherein the detaching of the donor substrate at the localized implanted regions along the discontinuous embrittlement plane comprises initiating the detachment thermally, or mechanically by applying a mechanical stress.

11. The method of claim 1, further comprising recycling the donor substrate after transferring the blocks, the recycling comprising treating the free surface of the donor substrate to planarize and decrease roughness of the free surface of the donor substrate.

12. The method of claim 1, further comprising selecting the receiver substrate to comprise silicon, and wherein the blocks of the donor substrate comprise a III-V semiconductor material.

13. A composite substrate comprising:
    a receiver substrate; and
    a donor substrate disposed on the receiver substrate comprising:
        a discontinuous embrittlement plane comprising localized implanted regions formed through ion implantation, the localized implanted regions disposed vertically in line with one or more patterns on the donor substrate, the localized implanted regions delimiting a surface region of the donor substrate; and
        one or more blocks bonded to the receiver substrate, the blocks located vertically in line with the respective implanted regions of the embrittlement plane, each block comprising a respective portion of the surface region of the donor substrate.

14. The composite substrate of claim 13, wherein the receiver substrate comprises silicon and the one or more blocks of the donor substrate comprise a III-V semiconductor material.

* * * * *